United States Patent
Gerousis et al.

(10) Patent No.: US 10,886,224 B2
(45) Date of Patent: Jan. 5, 2021

(54) POWER DISTRIBUTION NETWORK USING BURIED POWER RAIL

(71) Applicant: Samsung Electronics Co., Ltd., Suwon-si (KR)

(72) Inventors: Vassilios Gerousis, Liberty Hill, TX (US); Rwik Sengupta, Leander, TX (US); Joon Goo Hong, Austin, TX (US); Kevin Michael Traynor, Livingston, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/561,340

(22) Filed: Sep. 5, 2019

(65) Prior Publication Data

US 2020/0373241 A1  Nov. 26, 2020

Related U.S. Application Data

(60) Provisional application No. 62/851,468, filed on May 22, 2019.

(51) Int. Cl.
*H01L 23/528* (2006.01)
*H01L 23/522* (2006.01)

(52) U.S. Cl.
CPC ...... *H01L 23/5286* (2013.01); *H01L 23/5226* (2013.01); *H01L 23/5283* (2013.01)

(58) Field of Classification Search
CPC ............. H01L 23/5286; H01L 23/5226; H01L 23/5283; H01L 23/528
See application file for complete search history.

(56) References Cited

U.S. PATENT DOCUMENTS

| | | |
|---|---|---|
| 4,802,062 A | 1/1989 | Blum et al. |
| 7,760,578 B2 | 7/2010 | Vinke et al. |
| 8,349,723 B2 | 1/2013 | Filippi et al. |
| 8,507,957 B2 | 8/2013 | Hou et al. |
| 8,723,269 B2 | 5/2014 | Rockett |
| 8,941,150 B2 | 1/2015 | Sherlekar et al. |
| 9,565,762 B1 | 2/2017 | Azeroual et al. |
| 9,570,395 B1 | 2/2017 | Sengupta et al. |
| 10,020,254 B1 | 7/2018 | Bao et al. |
| 2017/0294448 A1 | 10/2017 | Debacker et al. |
| 2018/0145030 A1 | 5/2018 | Beyne et al. |

(Continued)

*Primary Examiner* — Scott B Geyer
(74) *Attorney, Agent, or Firm* — Lewis Roca Rothgerber Christie LLP (57) ABSTRACT

A tap cell configured to enable electrical connection from a buried power rail of an integrated circuit to a power distribution network includes. The tap cell includes a buried power rail layer including VDD and VSS power supply lines, insulating layers and metal layers alternately arranged on the buried power rail layer, a first power supply interconnect in metal layer M1 or higher electrically coupled to the VDD power supply line, and a second power supply interconnect in metal layer M1 or higher electrically connected to the VSS power supply line. The first power supply interconnect and the second power supply interconnect are configured to be electrically connected to the power distribution network, and the VDD and VSS power supply lines are configured to supply power from the power distribution network to the buried power rail of the integrated circuit. The tap cell is free of any active semiconductor devices.

18 Claims, 7 Drawing Sheets

(56) References Cited

U.S. PATENT DOCUMENTS

| | | |
|---|---|---|
| 2018/0182675 A1 | 6/2018 | Zeng et al. |
| 2018/0218973 A1 | 8/2018 | Nelson et al. |
| 2018/0374791 A1 | 12/2018 | Smith et al. |
| 2019/0122986 A1 | 4/2019 | Yang et al. |
| 2020/0042668 A1* | 2/2020 | Peng ..................... G03F 1/36 |

* cited by examiner

POWER DISTRIBUTION NETWORK USING BURIED POWER RAIL

CROSS-REFERENCE TO RELATED APPLICATION(S)

This application claims priority to and the benefit of U.S. Provisional Application No. 62/851,468, filed May 22, 2019, the entire content of which is incorporated herein by reference.

BACKGROUND

1. Field

The present disclosure relates generally to integrated circuits having a buried power rail and methods of manufacturing the same.

2. Description of Related Art

Standard semiconductor cells include a set of logic devices (e.g., semiconductor devices, such as p-type field effect transistors (pFETs), n-type FETs (nFETS), inverters, NAND gates, NOR gates, flip flops, or other logic circuits) that are connected to the power rails in the cell (e.g., VDD and VSS power supply lines) for supplying power to the logic devices, and the cell power rails are connected to a power distribution network when the semiconductor cells are integrated into a semiconductor chip. Some related art semiconductor cells include power rails that are below the logic devices, known in the art as buried power rails. Cells with buried power rails are generally designed for small cell areas. However, in related art semiconductor cells with buried power rails, the buried power rails cannot be connected directly to the power distribution network because the buried power rails are typically three or more metal layers below the first accessible metal layer in the back-end-of-line (BEOL) of the semiconductor cell (e.g., the buried power rails are three metal layers below metal layer M1 in the BEOL). Accordingly, although cells with buried power rails are designed for small cell areas, in the related art, the standard via connection inside the semiconductor cell to connect the buried power rails to the power distribution network inhibits scaling. Therefore, in related art semiconductor cells, the buried power rails and the connections between the buried power rails and the power distribution network, inhibit scaling of the semiconductor cells.

SUMMARY

The present disclosure is directed to various embodiments of a tap cell configured to enable electrical connection from a buried power rail of an integrated circuit or cell to a power distribution network (PDN). In one embodiment, the tap cell includes a buried power rail layer including VDD and VSS power supply lines, a series of insulating layers and a series of metal layers alternately arranged on the buried power rail layer, a first power supply interconnect in metal layer M1 or higher of the series of metal layers that is electrically coupled to the VDD power supply line, a second power supply interconnect in the metal layer M1 or higher that is electrically connected to the VSS power supply line. The first power supply interconnect and the second power supply interconnect are configured to be electrically connected to the power distribution network, and the VDD and VSS power supply lines are configured to supply power from the power distribution network to the buried power rail of the integrated circuit. The tap cell is free of any active semiconductor devices.

The first power supply interconnect and the second power supply interconnect may be in the metal layer M1.

The tap cell may include a metal interconnect in metal layer M-1 of the series of metal layers that is electrically connected to the VDD power supply line or the VSS power supply line by a via in via layer V-2 of the series of insulating layers. The tap cell may also include a metal interconnect in metal layer M0 of the series of metal layers that is electrically connected to the metal interconnect in metal layer M-1 by a via in via layer V-1 of the series of insulating layers. The tap cell may also include a via in via layer V0 electrically connecting the metal interconnect in metal layer M0 to the first power supply interconnect or the second power supply interconnect.

The first power supply interconnect and the second power supply interconnect may be in metal layer M2 of the series of metal layers.

The tap cell may include a metal interconnect in metal layer M-1 of the series of metal layers electrically connected to the VDD power supply line or the VSS power supply line by a via in via layer V-2 of the series of insulating layers. The tap cell may also include a metal interconnect in metal layer M0 of the series of metal layers electrically connected to the metal interconnect in metal layer M-1 by a via in via layer V-1 of the series of insulating layers. The tap cell may also include a metal interconnect in metal layer M1 of the series of metal layers electrically connected to the metal interconnect in metal layer M0 by a via in via layer V0 of the series of insulating layers. The tap cell may also include a via in via layer V1 electrically connecting the metal interconnect in metal layer M1 to the first power supply interconnect or the second power supply interconnect.

The tap cell may includes at least one super-via directly connecting at least one of the first power supply interconnect to the VDD power supply line or the second power supply interconnect to the VSS power supply line.

The first power supply interconnect may be electrically coupled to the VDD power supply line without vias below via layer V0.

The first power supply interconnect may be electrically connected to the VSS power supply line without vias below via layer V0.

The present disclosure is also directed to various embodiments of a semiconductor integrated circuit. In one embodiment, the semiconductor integrated circuit includes at least one first tap cell in a first column, at least one second tap cell in a second column spaced apart from the at least one first tap cell by a distance, and at least one semiconductor cell between the at least one first tap cell and the at least one second tap cell. The at least one semiconductor cell includes VDD and VSS power supply lines in a buried power rail layer, at least one active semiconductor device in an active layer on the buried power rail layer, and a series of metal interconnects and vias connecting the at least one active semiconductor device to the VDD and VSS power supply lines. The at least one first tap cell and the at least one second tap cell are configured to supply power from the power distribution network to the VDD and VSS power supply lines of the at least one semiconductor cell.

Each of the first tap cell and the second tap cell may be connected to the power distribution network in a regular stripe, a mesh, or rings.

The at least one semiconductor cell may include a super-via directly connecting a metal interconnect of the series of metal interconnects to the VDD power supply line or the VSS power supply line.

The at least one first tap cell may include a series of first tap cells in the first column, and the at least one second tap cell may include a series of second tap cells in the second column.

The semiconductor integrated circuit may also include a via staple connecting the at least one first tap cell or the at least one second tap cell to the power distribution network.

The semiconductor integrated circuit may include a via ladder connecting the at least one first tap cell or the at least one second tap cell to the power distribution network.

The present disclosure is also directed to various embodiments of a semiconductor cell. In one embodiment, the semiconductor cell includes a buried power rail layer including VDD and VSS power supply lines, a device layer on the buried power rail layer including at least one active semiconductor device, a series of insulating layers and a series of metal layers alternately arranged on the device layer, a first power supply interconnect in metal layer M1 or higher of the series of metal layers that is electrically coupled to the VDD power supply line, a second power supply interconnect in the metal layer M1 or higher that is electrically connected to the VSS power supply line, and at least one super-via directly connecting the first power supply interconnect to the VDD power supply line or connecting the second power supply interconnect to the VSS power supply line. The first power supply interconnect and the second power supply interconnect are configured to be electrically connected to a power distribution network. The VDD and VSS power supply lines are configured to supply power from the power distribution network to the at least one active semiconductor device. The at least one super-via extends through at least two insulating layers of the plurality of insulating layers and at least one metal layer of the plurality of metal layers.

The at least one super-via may be an array of two or more super-vias.

The first power supply interconnect and the second power supply interconnect may be in the metal layer M1, and the at least one super-via may extend through three insulating layers of the series of insulating layers and two metal layers of the series of metal layers.

The first power supply interconnect and the second power supply interconnect may be in metal layer M2 of the series of metal layers, and the at least one super-via may extend through four insulating layers of the series of insulating layers and three metal layers of the series of metal layers.

This summary is provided to introduce a selection of concepts that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

DETAILED DESCRIPTION

The present disclosure is directed to various embodiments of a tap cell configured to enable electrical connection from a buried power rail of an integrated circuit or cell to a power distribution network (PDN). In one or more embodiments, the tap cell may include a super-via directly connecting a buried power rail of the tap cell to a metal interconnect in a back-end-of-line (BEOL) metal layer (e.g., metal layer M1 or metal layer M2). The present disclosure is also directed to various embodiments of an integrated circuit or cell including one or more super-vias directly connecting a metal interconnect in a BEOL metal layer (e.g., metal layer M1 or metal layer M2) to a buried power rail. The present disclosure is also directed to various embodiments of a semiconductor chip including a pair of spaced apart tap cells and at least one semiconductor cell between the pair of tap cells. In one or more embodiments, one or more of the semiconductor cells between the pair of spaced apart tap cells may include one or more super-vias such that the semiconductor chips according to one or more embodiments of the present disclosure include a combination of both tap cells and one or more super-vias for connecting the buried power rails to the power distribution network.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1A:
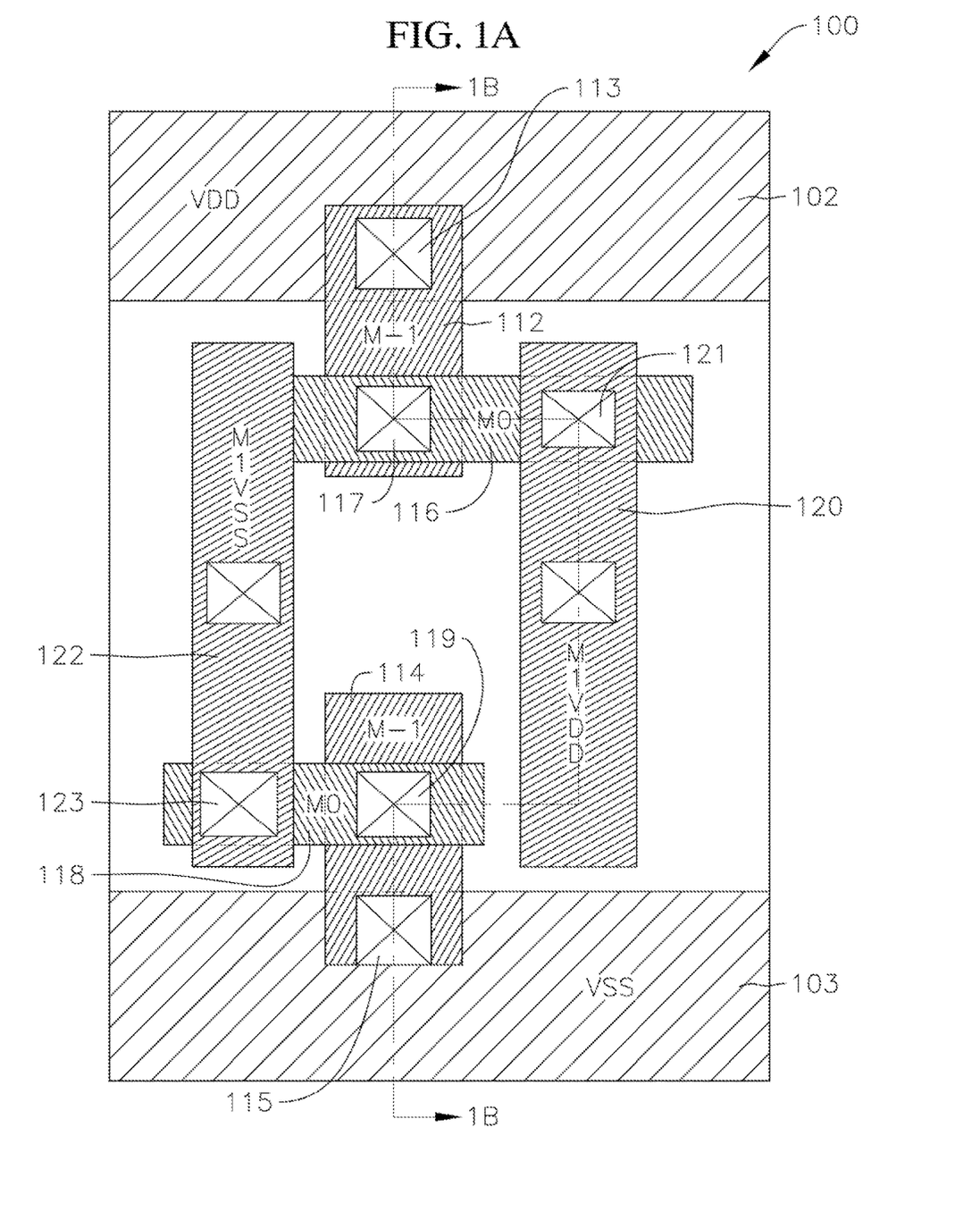
FIGS. 1A-1B are a top layout view and a cross-sectional side view, respectively, of a tap cell according to one embodiment of the present disclosure.
Figure 1B:
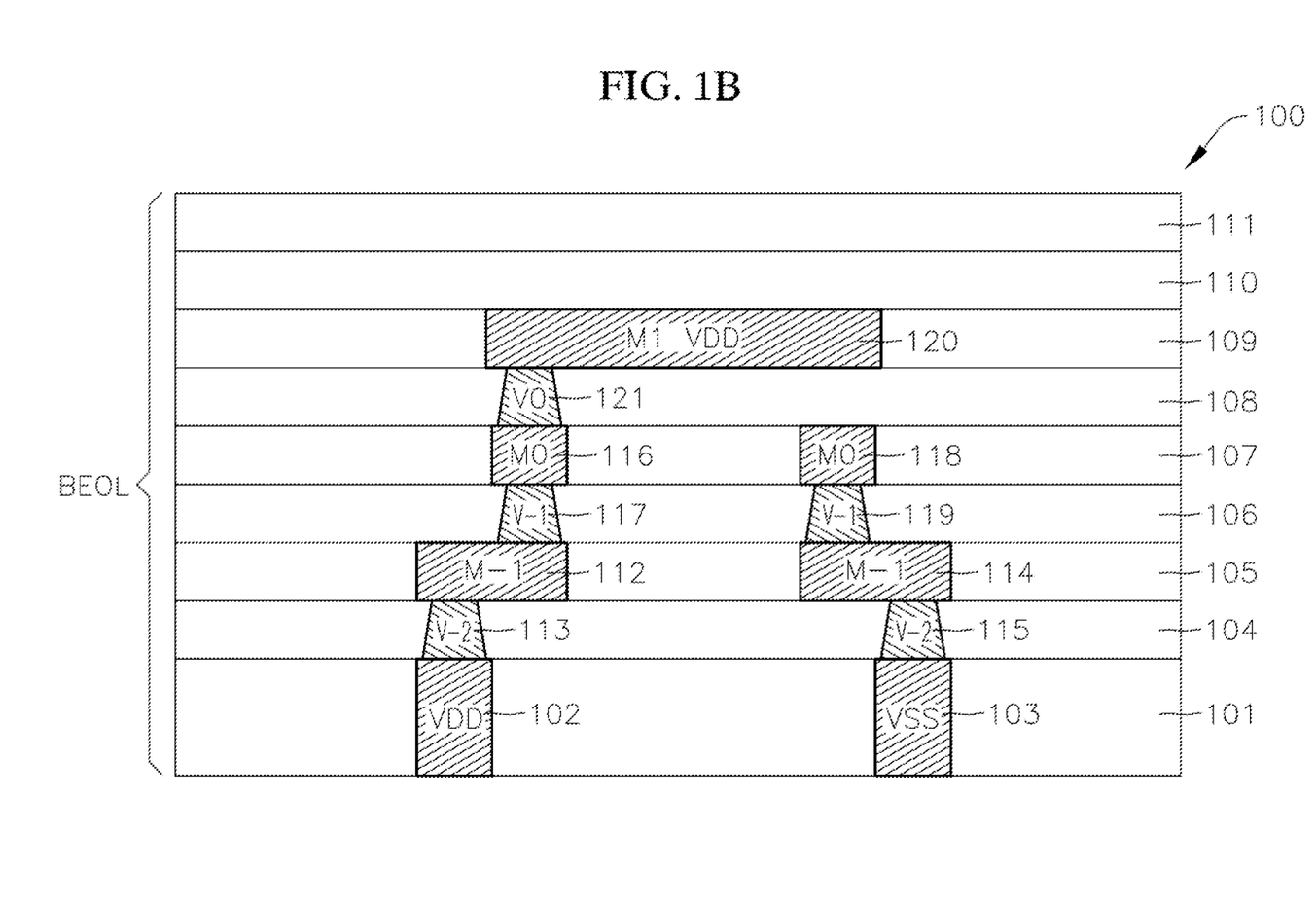

FIGS. 1A-1B are quasi-orthogonal views of an embodiment of a tap cell 100 according to one embodiment of the present disclosure configured to enable electrical connection from a buried power rail of an integrated circuit or cell to a power distribution network (PDN). In the illustrated embodiment, the tap cell 100 includes a buried power rail layer 101 including VDD and VSS power supply lines 102, 103, respectively, and a series of insulating layers and metal layers alternately arranged on the buried power rail layer 101. In the illustrated embodiment, the tap cell 100 includes a first insulating layer (Via (V-2) layer) 104 on the buried power rail layer 101 (FIG. 1A), a first metal layer (Metal-1 (M-1) layer) 105 on the first insulating layer (V-2 layer) 104, a second insulating layer (Via (V-1) layer) 106 on the first metal layer (M-1) 105, a second metal layer (Metal 0 (M0) layer) 107 on the second insulating layer (V-1) 106, a third insulating layer (Via 0 (V0) layer) 108 on the second metal layer (M0) 107, a third metal layer (Metal 1 (M1) layer) 109 on the third insulating layer (V0) 108, a fourth insulating layer (Via 1 (V1) layer) 110 on the third metal layer (M1) 109, and a fourth metal layer (Metal 2 (M2) layer) 111 on the fourth insulating layer (V1) 110. In one or more embodiments, the tap cell 100 includes additional insulating and metal layers (e.g., insulating layer V2 on the metal layer M2 111, metal layer M3 on insulating layer V2, and insulating layer V3 on metal layer M3).

Additionally, in the illustrated embodiment, the tap cell 100 may be free of any active devices (e.g., semiconductor devices, such as p-type field effect transistors (pFETs), n-type FETs (nFETS), inverters, NAND gates, NOR gates, flip flops, or other logic circuits).

In one or more embodiments, the tap cell 100 includes a series of staggered vias connecting the VDD and VSS power supply lines 102, 103 to metal interconnects in metal layer M1 109 or higher (e.g., metal layer M2, metal layer M3, or metal layer M4). In the illustrated embodiment, the tap cell 100 includes a first metal interconnect 112 in the first metal layer (M-1) 105 connected to the VDD power supply line 102 by a via 113 in the first insulating layer (V-2 layer) 104, and a second metal interconnect 114 in the first metal layer (M-1) 105 connected to the VSS power supply line 103 via a 115 in the first insulating layer (V-2 layer) 104. In the illustrated embodiment, the tap cell 100 also includes a third metal interconnect 116 in the second metal layer (M0) 107 connected to the first metal interconnect 112 with a via 117 in the second insulating layer (V-1) 106, and a fourth metal interconnect 118 in the second metal layer (M0) 107 connected to the second metal interconnect 114 with a second via 119 in the second insulating layer (V-1) 106. In the illustrated embodiment, the tap cell 100 also includes a VDD power supply interconnect 120 in the third metal layer (M1) 109 connected to the third metal interconnect 116 with a via 121 in the third insulating layer (V0) 108, and a VSS power supply interconnect 122 in the third metal layer (M1) 109 connected to the fourth metal interconnect 118 with a via 123 in the third insulating layer (V0) 108. In this manner, the tap cell 100 promotes the VDD power supply line 102 and the VSS power supply line 103 from the buried power rail layer 101 to the third metal layer (M1) 109 in the back-end-of-line (BEOL).

In one or more embodiments, the tap cell 100 may promote the VDD power supply line 102 and the VSS power supply line 103 from the buried power rail layer 101 to the fourth metal layer M2 111 or higher in the BEOL. For example, in one or more embodiments, the tap cell 100 may include a VDD power supply interconnect and a VSS power supply interconnect in the fourth metal layer M2 111 and a series of staggered metal interconnects and vias in metal layers M2, M1, M0, M-1 and insulating layers V1, V0, V-1, V-2, respectively, connecting the VDD and VSS power supply interconnects to the VDD power supply line 102 and the VSS power supply line 103, respectively.

The VDD power supply interconnect 120 and the VSS power supply interconnect 122 are connected to the PDN. In one or more embodiments, the PDN may be a mesh, strips, and/or a ring. In one or more embodiments, the PDN may be located at metal layer 4 (M4) or higher (e.g., metal layer M5 or metal layer M6). In one or more embodiments, the VDD power supply interconnect 120 and the VSS power supply interconnect 122 may be connected to the PDN with one or more via staples (e.g., one or more via staples may connect the VDD power supply interconnect 120 and the VSS power supply interconnect 122 at metal layer M1 109 of the tap cell 100 to the PDN mesh or stripes at metal layer M4 or higher). In one or more embodiments, the VDD power supply interconnect 120 and the VSS power supply interconnect 122 of the tap cell 100 may be connected to the PDN with a via ladder (e.g., an array of via cuts starting with via layer 1 (V1) 110 on the third metal layer (M1) 109 and ending with metal layer M4 or higher at which the PDN is located). For example, to connect the VDD power supply interconnect 120 and the VSS power supply interconnect 122 of the tap cell 100 to the PDN according to one or more embodiments, each metal layer of the cell 100 above the VDD power supply interconnect 120 and the VSS power supply interconnect 122 may include one or more segments of wire (e.g., two segments of wire in parallel) and each via layer may include at least two vias (one for each segment of wire) to connect to the next metal layer. In one or more embodiments, the tap cell 100 may include one or more additional layers not pictured in FIGS. 1A-1B, such as, for instance, additional metal layers and/or insulating layers as needed.

Figure 2A:
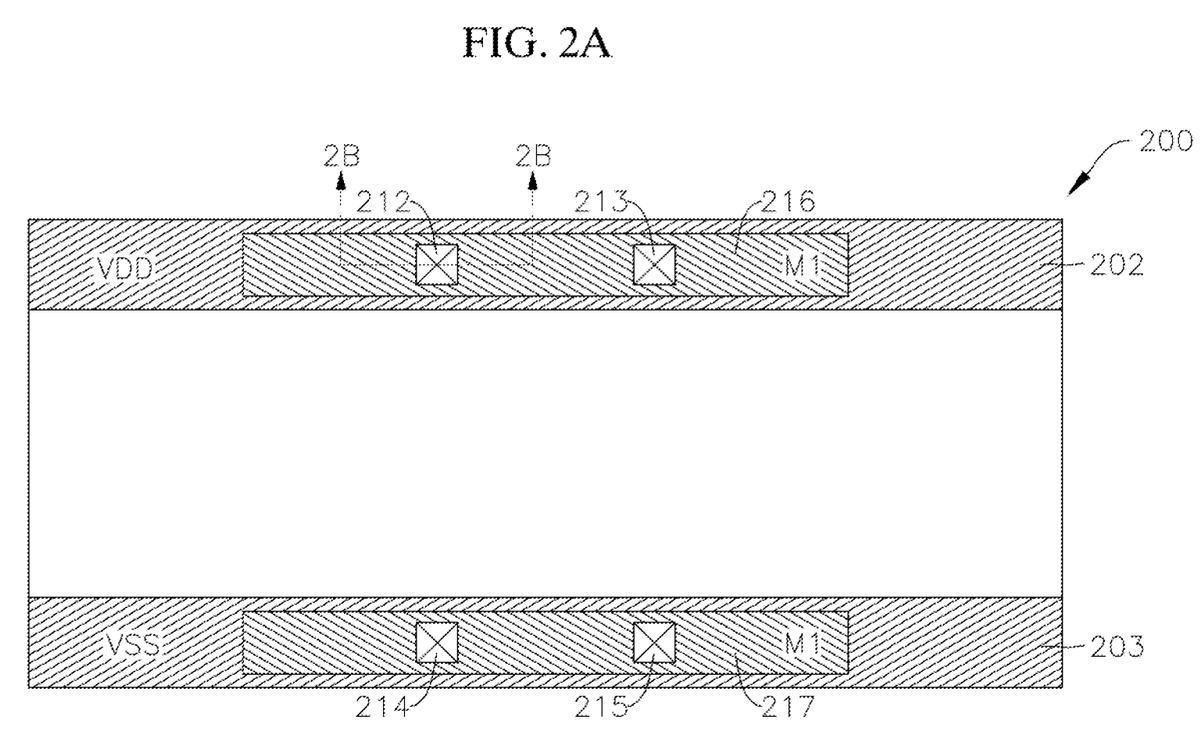
FIGS. 2A-2B are a top layout view and a cross-sectional side view, respectively, of a tap cell according to another embodiment of the present disclosure including a super-via.
Figure 2B:
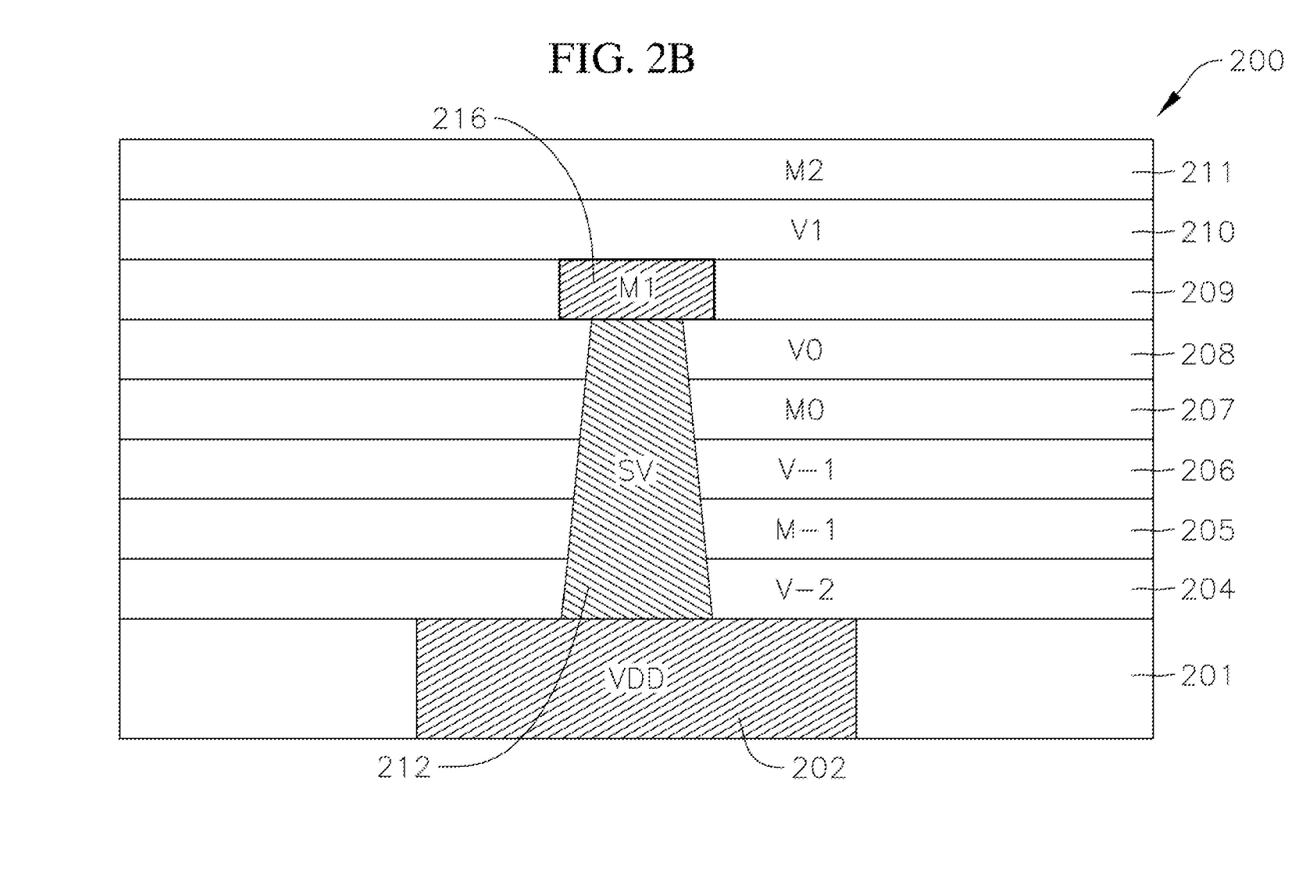

FIGS. 2A-2B are quasi-orthogonal views of an embodiment of a tap cell 200 according to one embodiment of the present disclosure. In the illustrated embodiment, the tap cell 200 includes a buried power rail layer 201 including VDD and VSS power supply lines 202, 203, respectively, and a series of insulating layers and metal layers alternately arranged on the buried power rail layer 201. In the illustrated embodiment, the tap cell 200 includes a first insulating layer (V-2) 204 on the buried power rail layer 201, a first metal layer (M-1) 205 on the first insulating layer (V-2) 204, a second insulating layer (V-1) 206 on the first metal layer (M-1) 205, a second metal layer (M0) 207 on the second insulating layer (V-1) 206, a third insulating layer (V0) 208 on the second metal layer (M0) 207, a third metal layer (M1) 209 on the third insulating layer (V0) 208, a fourth insulating layer (V1) 210 on the third metal layer (M1) 209, and a fourth metal layer (M2) 211 on the fourth insulating layer (V1) 210. In one or more embodiments, the tap cell 200 may include one or more additional layers not pictured in FIGS. 2A-2B, such as, for instance, additional metal layers and/or insulating layers as needed.

Additionally, in the illustrated embodiment, the tap cell 200 may be free of any active devices (e.g., semiconductor devices, such as pFETs, nFETS, inverters, NAND gates, NOR gates, flip flops, or other logic circuits).

In the illustrated embodiment, the tap cell 200 includes two super-vias 212, 213 and 214, 215 connected to each of the VDD and VSS power supply lines 202, 203, respectively (e.g., two super-vias arranged in an array connected to each of the VDD and VSS power supply lines 202, 203). In one or more embodiments, the tap cell 200 may include any other suitable number of super-vias connected to each of the VDD and VSS power supply lines 202, 203, such as, for instance, a single super-via connected to each of the VDD and VSS power supply lines 202, 203 (e.g., 212 and 214) or three or more super-vias connected to each of the VDD and VSS power supply lines 202, 203 (e.g., an array of three or more super-vias connected to each of the VDD and VSS power supply lines 202, 203). In the illustrated embodiment, the super-vias 212, 213 and 214, 215 directly connect the VDD and VSS power supply lines 202, 203 to VDD and VSS power supply interconnects 216, 217, respectively, in metal layer M1 209. In one or more embodiments, the super-vias may directly connect the VDD and VSS power supply lines 202, 203 to VDD and VSS power supply interconnects in a metal layer in the back-end-of-line (BEOL) that is higher than metal layer M1 209. For instance, in one or more embodiments, the super-vias 212, 213 and 214, 215 may directly connect the VDD and VSS power supply lines 202, 203 to metal interconnects in metal layer M2 211 or metal layer M3. Additionally, in the illustrated embodiment, each of the super-vias 212, 213 and 214, 215 pass through two metal layers (i.e., metal layer M-1 205 and metal layer M0 207). In one or more embodiments, the super-vias 212, 213 and 214, 215 may pass through three metal layers (i.e., metal layer M-1 205, metal layer M0 207, and metal layer M1 209) or four metal layers (i.e., metal layer M-1 205, metal layer M0 207, metal layer M1 209, and metal layer M2 211). In one or more embodiments, the super-vias 212, 213 and 214, 215 may pass through more than four metal layers. In this manner, the super-vias 212, 213 and 214, 215 replace at least three vias (e.g., V-2, V-1, and V0; or V-2, V-1, V0, and V1), and the super-vias 212, 213 and 214, 215 of the tap cell 200 promote the VDD power supply line 202 and the VSS power supply line 203 from the buried power rail layer 201 to the third metal layer (M1) 209 or higher in the BEOL.

The VDD power supply interconnect 216 and the VSS power supply interconnect 217 are connected to the PDN. In one or more embodiments, the PDN may be a mesh, strips, and/or a ring. In one or more embodiments, the PDN may be located at metal layer 4 (M4) or higher (e.g., metal layer M5 or metal layer M6). In one or more embodiments, the VDD power supply interconnect 216 and the VSS power supply interconnect 217 may be connected to the PDN with one or more via staples (e.g., one or more via staples may connect the VDD power supply interconnect 216 and the VSS power supply interconnect 217 at metal layer M1 209 of the tap cell 200 to the PDN mesh or stripes at metal layer M4 or higher). In one or more embodiments, the VDD power supply interconnect 216 and the VSS power supply interconnect 217 of the tap cell 200 may be connected to the PDN with a via ladder (e.g., an array of via cuts starting with via layer 1 (V1) 210 on the third metal layer (M1) 209 and ending with metal layer M4 or higher at which the PDN is located).

Figure 3:
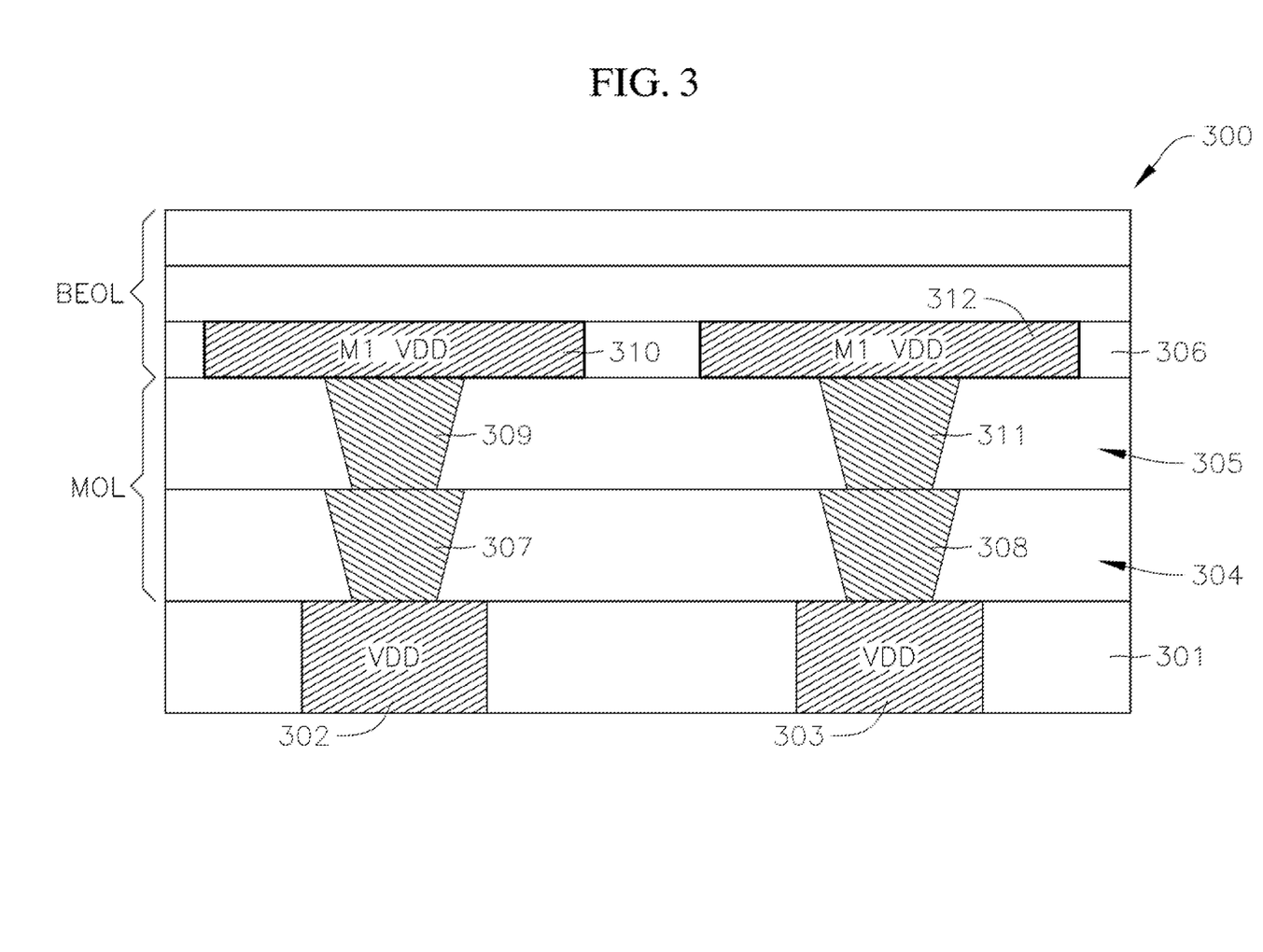
FIG. 3 is a cross-sectional side view of a tap cell according to another embodiment of the present disclosure.

FIG. 3 is a view of an embodiment of a tap cell 300 according to one embodiment of the present disclosure configured to enable electrical connection from a buried power rail of an integrated circuit or cell to a power distribution network (PDN). In the illustrated embodiment, the tap cell 300 includes a buried power rail layer 301 including VDD and VSS power supply lines 302, 303, respectively, and two or more middle-of-line (MOL) layers 304, 305 (e.g., M0 and M-1 MOL layers) on the buried power rail layer 301.

Additionally, in the illustrated embodiment, the tap cell 300 may be free of any active devices (e.g., semiconductor devices, such as p-type field effect transistors (pFETs), n-type FETs (nFETS), inverters, NAND gates, NOR gates, flip flops, or other logic circuits).

In one or more embodiments, the two or more MOL layers 304, 305 include metal interconnects connecting the VDD and VSS power supply lines 302, 303 to metal interconnects in metal layer M1 306 or higher (e.g., metal layer M2, metal layer M3, or metal layer M4) in the back-end-of line (BEOL). In the illustrated embodiment, the tap cell 300 includes a first metal interconnect 307 (e.g., a TS layer) in the M-1 MOL 304 directly connected to the VDD power supply line 302 (e.g., without a via), and a second metal interconnect 308 (e.g., a TS layer) in the M-1 MOL 304 directly connected to the VSS power supply line 303 (e.g., without a via). In the illustrated embodiment, the tap cell 300 also includes a third metal interconnect 309 (e.g., a CA or CB layer) in the M0 MOL 305 directly connected to the first metal interconnect 307 (e.g., without a via) and directly connected to a VDD power supply interconnect 310 in metal layer M1 306 (e.g., without a via). In the illustrated embodiment, the tap cell 300 also includes a fourth metal interconnect 311 (e.g., a CA or CB layer) in the M0 MOL 305 directly connected to the second metal interconnect 308 (e.g., without a via) and directly connected to a VSS power supply interconnect 312 in metal layer M1 306 (e.g., without a via). In this manner, the tap cell 300 promotes the VDD power supply line 302 and the VSS power supply line 303 from the buried power rail layer 301 to metal layer M1 306 in the BEOL without the use of vias (e.g., the two or more MOL layers 304, 305 may not include any vias). That is, in the illustrated embodiment, the tap cell 300 utilizes local interconnect in the cells in which the overlap between the first metal interconnect 307 and the third metal interconnect 309 connects these layers without the use of vias, and the overlap between the second metal interconnect 308 and the fourth metal interconnect 310 connects these layers without the use of vias.

In one or more embodiments, the tap cell 300 may promote the VDD power supply line 302 and the VSS power supply line 303 from the buried power rail layer 301 to metal layer M2 or higher in the BEOL. For example, in one or more embodiments, the tap cell 300 may include three or more MOL layers to connect the VDD power supply line 302 and the VSS power supply line 303 in the buried power rail layer 301 to VDD and VSS power supply interconnects in metal layer M2 or higher in the BEOL.

The VDD power supply interconnect 310 and the VSS power supply interconnect 312 are connected to the PDN. In one or more embodiments, the PDN may be a mesh, strips, and/or a ring. In one or more embodiments, the PDN may be located at metal layer 4 (M4) or higher (e.g., metal layer M5 or metal layer M6). In one or more embodiments, the VDD power supply interconnect 310 and the VSS power supply interconnect 312 may be connected to the PDN with one or more via staples (e.g., one or more via staples may connect the VDD power supply interconnect 310 and the VSS power supply interconnect 312 at metal layer M1 306 of the tap cell 300 to the PDN mesh or stripes at metal layer M4 or higher). In one or more embodiments, the VDD power supply interconnect 310 and the VSS power supply interconnect 312 of the tap cell 300 may be connected to the PDN with a via ladder.

Figure 4:
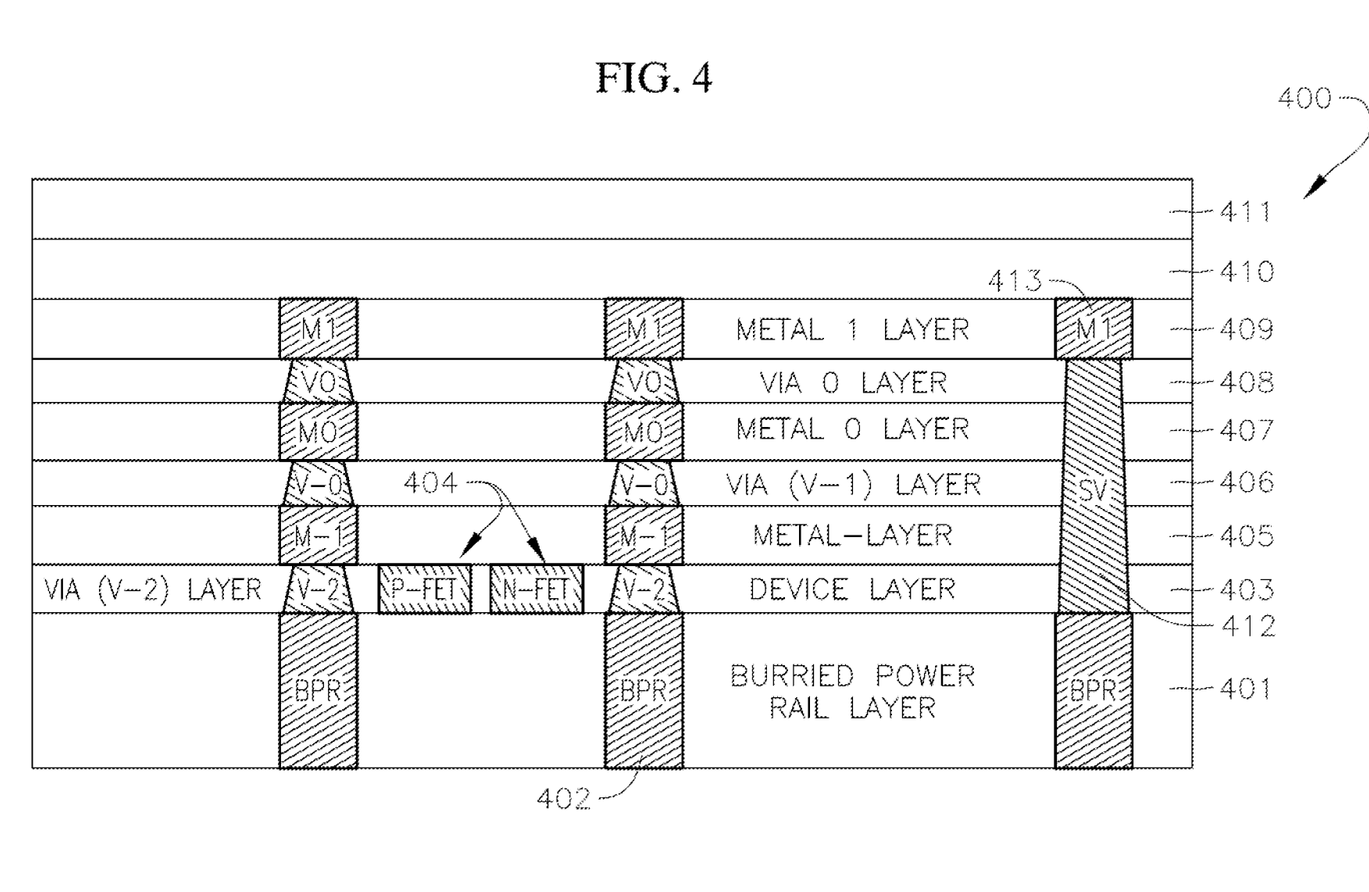
FIG. 4 is a side view of a semiconductor integrated circuit including a buried power rail and a super-via connected to the buried power rail according to one embodiment of the present disclosure.

With reference now to FIG. 4, a semiconductor cell 400 according to one embodiment of the present disclosure includes a buried power rail layer 401 including buried power rails 402, a first insulating layer (i.e., a device layer) 403 including one or more active devices 404 (e.g., one or more semiconductor devices, such as p-type field effect transistors (pFETs), n-type FETs (nFETs), inverters, NAND gates, NOR gates, flip flops, and/or other logic circuits) in a front-end-of-line (FEOL) of the semiconductor cell 400, and a back-end-of-line (BEOL) including a first metal layer (Metal-1 (M-1) layer) 405 on the device layer 403, a second insulating layer (Via (V-1) layer) 406 on the first metal layer (M-1) 405, a second metal layer (Metal 0 (M0) layer) 407 on the second insulating layer (V-1) 406, a third insulating layer (Via 0 (V0) layer) 408 on the second metal layer (M0) 407, and a third metal layer (Metal 1 (M1) layer) 409 on the third insulating layer (V0) 408, a fourth insulating layer (Via 1 (V1) layer) 410 on the third metal layer (M1) 409, and a fourth metal layer (Metal layer 2 (M2) layer) 411 on the fourth insulating layer (V1) 410. In the illustrated embodiment, the buried power rails 402 in the buried power rail layer 301 are below the active devices 404 in the device layer 403.

Additionally, in the illustrated embodiment, the semiconductor cell 300 includes a super-via 412 directly connecting one of the buried power rails 402 in the buried power rail layer 301 to a metal interconnect 413 in metal layer M1 409 (e.g., the super-via 412 is a direct vertical connection from one of the buried power rails 402 to the metal interconnect 413 in metal layer M1 409). In one or more embodiments, the super-via 412 may directly connect one of the buried power rails 402 in the buried power rail layer 301 to a metal interconnect in a metal layer in the BEOL higher than metal layer M1 (e.g., metal layer M2 or metal layer M3). In this manner, the one or more super-vias 412 of the semiconductor cell 300 promote one of the buried power rails 402 from the buried power rail layer 301 to metal layer M1 409 or higher in the BEOL. Additionally, the metal interconnect 413 in metal layer M1 409 or higher may be connected to a power distribution network (PDN) at metal layer M4 or higher (e.g., metal layer M5 or metal layer M6). In one or more embodiments, the PDN may be a mesh, strips, and/or a ring. In one or more embodiments, the metal interconnect 413 in metal layer M1 409 or higher may be connected to the PDN with one or more via staples (e.g., one or more via staples may connect the metal interconnect 413 in metal layer M1 409 or higher of the semiconductor cell 300 to the PDN mesh or stripes at metal layer M4 or higher). In one or more embodiments, the metal interconnect 413 in metal layer M1 409 or higher may be connected to the PDN with a via ladder (e.g., an array of via cuts starting with via layer 1 (V1) 410 on the third metal layer (M1) 410 and ending with metal layer M4 or higher at which the PDN is located).

In the illustrated embodiment, the super-via 412 passes through two metal layers (i.e., metal layer M-1 405 and metal layer M0 407). In one or more embodiments, the super-via 412 may pass through three metal layers (i.e., metal layer M-1 405, metal layer M0 407, and metal layer M1 409) or four metal layers (i.e., metal layer M-1 405, metal layer M0 407, metal layer M1 409, and metal layer M2 411). In one or more embodiments, the super-via 412 may pass through more than four metal layers. In this manner, the super-via 412 replaces at least three vias (e.g., vias in via layer V-2 403, via layer V-1 406, and via layer V0 408; or via layer V-2 403, via layer V-1 406, via layer V0 408, and via layer V1 410), which would otherwise be present in related art semiconductor cells. Additionally, although in the illustrated embodiment the semiconductor cell 300 includes a single super-via 412 directly connecting one of the buried power rails 402 to the metal interconnect 413 in metal layer M1 409 or higher, in one or more embodiments, the semiconductor cell 300 may include two or more super-vias (e.g., an array of two or more super-vias directly connecting one of the buried power rails 402 to the metal interconnect 413 in metal layer M1 409 or higher).

Figure 5:
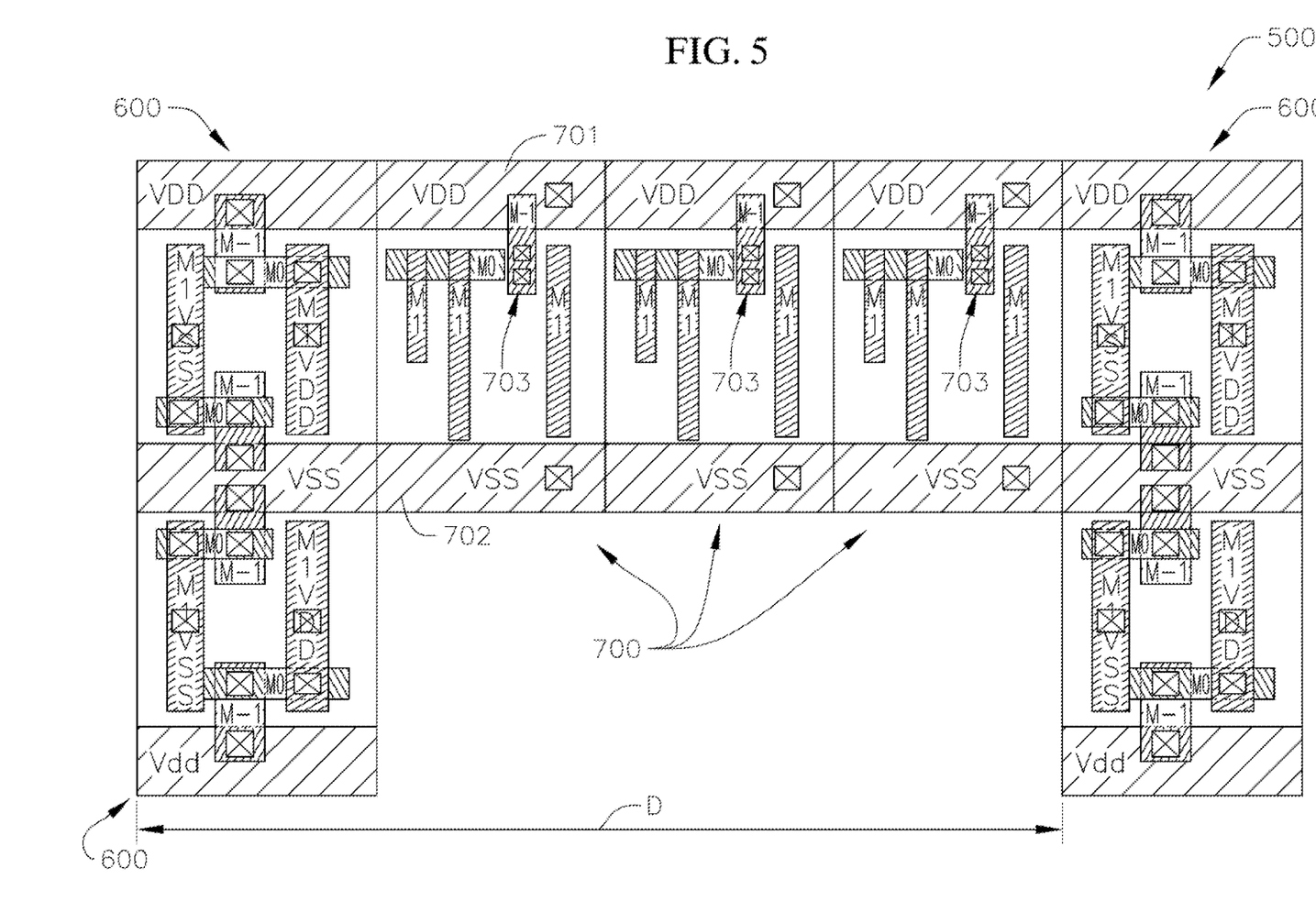
FIG. 5 is a top layout view of a semiconductor chip including a pair of spaced apart tap cells and at least one semiconductor cell between the spaced apart tap cells.

FIG. 5 is a top layout view of a semiconductor chip 500 according to one embodiment of the present disclosure. In the illustrated embodiment, the semiconductor chip 500 includes a series of tap cells 600 arranged in a regular set of columns (e.g., a first set of tap cells 600 arranged in a first column and a second set of tap cells 600 spaced apart from the first set of tap cells 600 by a distance D and arranged in a second column), and at least one semiconductor logic cell 700 between each corresponding pair of tap cells 600 in the first and second columns. The semiconductor logic cell 700 includes at least one active logic device (e.g., one or more p-type field effect transistors (pFETs), n-type FETs (nFETS), inverters, NAND gates, NOR gates, flip flops, and/or other logic circuits). Although in the illustrated embodiment the semiconductor chip 500 includes three semiconductor logic cells 700 between each corresponding pair of tap cells 600, in one or more embodiments the semiconductor chip 500 may include any other suitable number of semiconductor logic cells 700 between each pair of tap cells 600, such as, for instance, fewer than three semiconductor logic cells 700 (e.g., one or two semiconductor logic cells 700) or more than three semiconductor logic cells 700. In one or more embodiments, the distance D between each of the tap cells 600 in the first column and the corresponding tap cell 600 in the second column is set based on a voltage and current analysis for the full power distribution network (PDN) connection. In one or more embodiments, the distance D between each of the tap cells 600 in the first column and the corresponding tap cell 600 in the second column is set to provide the smallest voltage (IR) drop and the best current and EM density. In general, decreasing the distance D is configured to aid in distributing logic cell current in a robust manner for the remainder of the PDN (e.g., decreasing the distance D between each of the tap cells 600 in the first column and the corresponding tap cell 600 in the second column improves PDN robustness). In one or more embodiments, the distance D between each of the tap cells 600 in the first column and the corresponding tap cell 600 in the second column may be selected based on electrical modeling and analysis of the power network (e.g., the distance D may be any suitable distance selected by a chip designer based on various considerations utilized in electrical modeling and power network analysis).

In one or more embodiments, one or more of the tap cells 600 may be the same as or similar to the tap cell 100 described above with reference to FIGS. 1A-1B, one or more of the tap cells 600 may be the same as or similar to the tap cell 200 described above with reference to FIGS. 2A-2B, and/or one or more of the tap cells 600 may be the same as or similar to the tap cell 300 described above with reference to FIG. 3. Accordingly, in one or more embodiments, one or more of the tap cells 600 may include one or more super-vias and/or one or more of the tap cells 600 may be provided without a super-via. The tap cells 600 are configured to promote the VDD and VSS power supply lines (e.g., 102 and 103, 202 and 203, or 302 and 303) to metal layer M1 or higher in the BEOL of the tap cell 600, and the PDN may be connected to the M1 or higher VDD and the M1 or higher VSS of each tap cell 600 in a regular stripe, a mesh, or rings configuration. As described above, the M1 or higher VDD and the M1 or higher VSS may be connected to the PDN with one or more via staples or a via ladder.

In one or more embodiments, one or more of the semiconductor logic cells 700 may be a standard related art logic cell. In one or more embodiments, one or more of the semiconductor logic cells 700 may be the same as or similar to the embodiment of the semiconductor cell 400 described above with reference to FIG. 4 (e.g., one or more of the semiconductor logic cells 700 may include one or more super-vias). In one or more embodiments, one or more of the semiconductor logic cells 700 includes a buried power rail layer including VDD and VSS buried power rails 701, 702, a device layer on the buried power rail layer including one or more active logic devices 703 (e.g., one or more pFETs, nFETS, inverters, NAND gates, NOR gates, flip flops, and/or other logic circuits), and a back-end-of-line (BEOL) including a stack of alternating insulating layers and metal layers (e.g., a first metal layer (Metal-1 (M-1) layer) on the device layer, a second insulating layer (Via (V-1) layer) on the first metal layer (M-1), a second metal layer (Metal 0 (M0) layer) on the second insulating layer (V-1), a third insulating layer (Via 0 (V0) layer) on the second metal layer (M0), and a third metal layer (Metal 1 (M1) layer) on the third insulating layer (V0), a fourth insulating layer (Via 1 (V1) layer) on the third metal layer (M1), and a fourth metal layer (Metal layer 2 (M2) layer) on the fourth insulating layer (V1)). In the illustrated embodiment, the VDD and VSS buried power rails 701, 702 in the buried power rail layer are below the active logic devices 703 in the device layer.

In operation, the VDD and VSS power supply lines (e.g., 102 and 103, 202 and 203, or 302 and 303) of the tap cells 600, which are promoted to the metal interconnect in metal layer M1 or higher in the BEOL and are connected to the PDN with one or more via staples or a via ladder, supply power from the PDN to the VDD and VSS buried power rails 701, 702 of the semiconductor cells 700, and the VDD and VSS buried power rails 701, 702 of the semiconductor cells 700 supply power to the active logic devices 703 in the semiconductor cells 700. Additionally, in one or more embodiments, one or more of the semiconductor cells 700 may include one or more super-vias (e.g., super-via 412 in FIG. 4) such that one or more of the semiconductor cells 700 are connected to the PDN by the tap cells 600 as well as by the one or more super-vias within the semiconductor cell 700.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A tap cell configured to enable electrical connection from a buried power rail of an integrated circuit to a power distribution network, the tap cell comprising:
   a buried power rail layer comprising VDD and VSS power supply lines;
   a plurality of insulating layers and a plurality of metal layers alternately arranged on the buried power rail layer;
   a first power supply interconnect in metal layer M1 or higher of the plurality of metal layers, the first power supply interconnect being electrically coupled to the VDD power supply line; and a second power supply interconnect in the metal layer M1 or higher, the second power supply interconnect being electrically connected to the VSS power supply line, wherein the first power supply interconnect and the second power supply interconnect are configured to be electrically connected to the power distribution network, wherein the VDD and VSS power supply lines are configured to supply power from the power distribution network to the buried power rail of the integrated circuit, and wherein the tap cell is free of any active semiconductor devices.

2. The tap cell of claim 1, wherein the first power supply interconnect and the second power supply interconnect are in the metal layer M1.

3. The tap cell of claim 2, further comprising:
a metal interconnect in metal layer M-1 of the plurality of metal layers electrically connected to one of the VDD power supply line or the VSS power supply line by a via in via layer V-2 of the plurality of insulating layers;
a metal interconnect in metal layer M0 of the plurality of metal layers electrically connected to the metal interconnect in metal layer M-1 by a via in via layer V-1 of the plurality of insulating layers; and
a via in via layer V0 electrically connecting the metal interconnect in metal layer M0 to one of the first power supply interconnect or the second power supply interconnect.

4. The tap cell of claim 1, wherein the first power supply interconnect and the second power supply interconnect are in metal layer M2 of the plurality of metal layers.

5. The tap cell of claim 4, further comprising:
a metal interconnect in metal layer M-1 of the plurality of metal layers electrically connected to one of the VDD power supply line or the VSS power supply line by a via in via layer V-2 of the plurality of insulating layers;
a metal interconnect in metal layer M0 of the plurality of metal layers electrically connected to the metal interconnect in metal layer M-1 by a via in via layer V-1 of the plurality of insulating layers;
a metal interconnect in metal layer M1 of the plurality of metal layers electrically connected to the metal interconnect in metal layer M0 by a via in via layer V0 of the plurality of insulating layers; and
a via in via layer V1 electrically connecting the metal interconnect in metal layer M1 to one of the first power supply interconnect or the second power supply interconnect.

6. The tap cell of claim 1, further comprising at least one super-via, the at least one super-via electrically directly connecting at least one of the first power supply interconnect to the VDD power supply line or the second power supply interconnect to the VSS power supply line.

7. The tap cell of claim 1, wherein the first power supply interconnect is electrically coupled to the VDD power supply line without vias below via layer V0.

8. The tap cell of claim 1, wherein the first power supply interconnect is electrically connected to the VSS power supply line without vias below via layer V0.

9. A semiconductor integrated circuit comprising:
at least one first tap cell in a first column;
at least one second tap cell in a second column, the at least one second tap cell being spaced apart from the at least one first tap cell by a distance; and
at least one semiconductor cell between the at least one first tap cell and the at least one second tap cell, the at least one semiconductor cell comprising VDD and VSS power supply lines in a buried power rail layer, at least one active semiconductor device in an active layer on the buried power rail layer, and a plurality of metal interconnects and vias connecting the at least one active semiconductor device to the VDD and VSS power supply lines, wherein each of the at least one first tap cell and the at least one second tap cell is the tap cell of claim 1, and wherein the at least one first tap cell and the at least one second tap cell are configured to supply power from the power distribution network to the VDD and VSS power supply lines of the at least one semiconductor cell.

10. The semiconductor integrated circuit of claim 9, wherein each of the first tap cell and the second tap cell are connected to the power distribution network in a regular stripe, a mesh, or rings.

11. The semiconductor integrated circuit of claim 9, wherein the at least one semiconductor cell comprises a super-via directly connecting a metal interconnect of the plurality of metal interconnects to one of the VDD power supply line or the VSS power supply line.

12. The semiconductor integrated circuit of claim 9, wherein the at least one first tap cell comprises a plurality of first tap cells in the first column, and wherein the at least one second tap cell comprises a plurality of second tap cells in the second column.

13. The semiconductor integrated circuit of claim 9, further comprising a via staple connecting one of the at least one first tap cell or the at least one second tap cell to the power distribution network.

14. The semiconductor integrated circuit of claim 9, further comprising a via ladder connecting one of the at least one first tap cell or the at least one second tap cell to the power distribution network.

15. A semiconductor cell comprising:
a buried power rail layer comprising VDD and VSS power supply lines;
a device layer on the buried power rail layer, the device layer comprising at least one active semiconductor device;
a plurality of insulating layers and a plurality of metal layers alternately arranged on the device layer;
a first power supply interconnect in metal layer M1 or higher of the plurality of metal layers, the first power supply interconnect being electrically coupled to the VDD power supply line;
a second power supply interconnect in the metal layer M1 or higher, the second power supply interconnect being electrically connected to the VSS power supply line; and
at least one super-via, the at least one super-via directly connecting the first power supply interconnect to the VDD power supply line or connecting the second power supply interconnect to the VSS power supply line, wherein the first power supply interconnect and the second power supply interconnect are configured to be electrically connected to a power distribution network, wherein the VDD and VSS power supply lines are configured to supply power from the power distribution network to the at least one active semiconductor device, and wherein the at least one super-via extends through at least two insulating layers of the plurality of insulating layers and at least one metal layer of the plurality of metal layers.

16. The semiconductor cell of claim 15, wherein the at least one super-via comprises an array of two or more super-vias.

17. The semiconductor cell of claim 15, wherein the first power supply interconnect and the second power supply interconnect are in the metal layer M1, and wherein the at least one super-via extends through three insulating layers of the plurality of insulating layers and two metal layers of the plurality of metal layers.

18. The semiconductor cell of claim 15, wherein the first power supply interconnect and the second power supply interconnect are in metal layer M2 of the plurality of metal layers, and wherein the at least one super-via extends through four insulating layers of the plurality of insulating layers and three metal layers of the plurality of metal layers.

* * * * *